(12) United States Patent
Yokozeki

(10) Patent No.: US 6,552,946 B2
(45) Date of Patent: Apr. 22, 2003

(54) ADDRESS GENERATING CIRCUIT

(75) Inventor: Wataru Yokozeki, Kunitachi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/040,443

(22) Filed: Jan. 9, 2002

(65) Prior Publication Data

US 2002/0141273 A1 Oct. 3, 2002

(30) Foreign Application Priority Data

Mar. 30, 2001 (JP) ........................................ 2001-101825

(51) Int. Cl.$^7$ ................................................. G11C 7/00
(52) U.S. Cl. ................ 365/225.7; 385/226; 385/230.08
(58) Field of Search .............................. 365/225.7, 226, 365/230.08, 200, 189.05

(56) References Cited

U.S. PATENT DOCUMENTS 5,619,469 A    4/1997 Joo ........................ 365/225.7
6,275,443 B1 *  8/2001 Ingalls et al. .......... 365/230.08

FOREIGN PATENT DOCUMENTS

JP       08-321197    *  3/1996

OTHER PUBLICATIONS

US patent application Publication (US2002/0024877).*
US patent application Publication (US2002/0122331).*

* cited by examiner

*Primary Examiner*—Richard Elms
*Assistant Examiner*—Hien Nguyen
(74) *Attorney, Agent, or Firm*—Arent Fox Kintner Plotkin & Kahn, PLLC

(57) ABSTRACT

An address generating circuit having: a first switch transistor, a second switch transistor, a fuse element, and a power-ON reset circuit for outputting a first reset signal for controlling ON/OFF conditions of the first switch transistor and a second reset signal for controlling ON/OFF conditions of the second switch transistor. The address generating circuit also includes a latch circuit for latching and outputting a predetermined potential corresponding to a cut-off or a no cut-off condition of the fuse element. The first reset signal turns ON the first switch transistor during a first period immediately after the power supply is turned ON and always holds the first switch transistor in the OFF condition after the first period is completed. Furthermore, the second reset signal turns ON the second switch transistor at least during a second period after the first period and always holds the second switch transistor in the OFF condition after the second period is completed.

20 Claims, 9 Drawing Sheets

Prior art

ADDRESS GENERATING CIRCUIT

BACKGROUND OF THE INVENTION

1. Field of the Invention

The present invention relates to an address generating circuit and particularly to a redundant address generating circuit for storing an address of a defective memory cell (hereafter referred to as redundant address) in the memory cell array of a RAM (Random Access Memory), and generating the redundant address when the power supply of the RAM is turned ON.

2. Description of the Related Art

FIGS. 1(a) and 1(b) are schematic diagrams of an address generating circuit of the conventional art.

FIG. 1(a) is a circuit diagram illustrating an address generating circuit of the conventional art. In this figure, 41 is a first switch transistor consisting of PMOS transistor, 42 is a fuse element, 43 is a latch circuit, 44 is an inverter and 45 is a power-ON reset circuit.

In the address generating circuit of the conventional art illustrated in FIG. 1(a), a first switch transistor 41 and a fuse element 42 are connected sequentially in series between the power supply source $V_{DD}$ and the ground $V_{SS}$. A latch circuit 43 is comprised of two inverters. The input terminal of one inverter and the output terminal of the other inverter are mutually connected. The input node of the latch circuit 43 is connected to the connection node A of the first switch transistor 41 and fuse element 42, while the output node in the opposite side is connected to the inverter 44.

The power-ON reset circuit 45 outputs a reset signal RES. The reset signal RES is inputted to the gate of the first switch transistor 41. The fuse element 42 is selectively set in the cut-off condition or no cut-off condition in accordance with the address to be generated. Thereby, the binary information can be stored.

FIG. 1(b) is a waveform diagram illustrating the waveform of the reset signal RES to be inputted to the gate of the first switch.transistor 41. In this figure, the lateral axis t indicates the time, while the vertical axis V indicates voltage and $t_0$ indicates the time when the power supply is turned ON.

As illustrated in FIG. 1(b), when the power supply is turned ON at time $t_0$, the potential of the power supply source $V_{DD}$ rises with passage of time. When it reaches the predetermined power supply voltage, for example, 3.3V, it is maintained at this power supply voltage. Meanwhile, the power-ON reset circuit 45 operates in response to such rising of the level of the power supply source $V_{DD}$ and outputs the reset signal RES. The reset signal RES holds the ground potential until the time $t_1$ is delayed as much as the predetermined time from the time $t_0$ ($t_0$ is the time when the power supply is turned ON), and has the waveform following the rising of the level of the power supply source $V_{DD}$ after the time $t_1$. Namely, the reset signal RES has the waveform whereby the level rises like a step at the time $t_1$ as illustrated in FIG. 1(b).

Next, operations of the address generating circuit of FIG. 1(a) will be explained with reference to the waveform of the reset signal RES of FIG. 1(b).

Since the reset signal RES is held at the ground potential up to time $t_1$ from time $t_0$ after the power supply is turned ON, the first switch transistor 41 is turned ON. Therefore, the charges are supplied to the node A from the power supply source $V_{DD}$ and thereby the node A is held at a certain positive potential.

At the time $t_1$, the level of the reset signal RES rises like a step as illustrated in FIG. 1(b) and thereby the first switch transistor 41 is turned OFF. Therefore, when the fuse element 42 is in the no cut-off condition, charges accumulated in the node A transfer to the ground $V_{SS}$ via the fuse element 42 and the input node of the latch circuit 43 is held at the ground potential. Meanwhile, when the fuse element 42 is in the cut-off condition, certain charges are held in the node A and the potential of the input node of the latch circuit 43 is held at the certain positive potential.

Therefore, after the power supply is turned ON, the H level or L level is latched at the latch circuit 43 in accordance with the cut-off or no cut-off condition of the fuse element 42. When the fuse element 42 is set in the cut-off condition, the H level signal is outputted to the inverter 44 from the latch circuit 43. When the fuse element 42 is set in the non cut-off condition, the L level signal is outputted to the inverter 44. Accordingly, an address (binary information) stored in the address generating circuit is outputted via the inverter 44.

However, in the address generating circuit of the conventional art explained above, during the period when the power supply is turned OFF from being turned ON, a large voltage corresponding to the power supply voltage is always applied between both ends of the fuse element 42 in the fuse element 42 during the cut-off condition. Thereby, a small amount of current flows steadily through the fuse element 42.

Namely, the fuse element 42 actually has a resistance of about several M Ω even when it is in the cut-off condition. Therefore, even when the fuse element 42 is in the cut-off condition, a current path is steadily formed via the input node of the latch circuit 43, fuse element 42 and ground $V_{SS}$. Since the input node of latch circuit 43 is in the H level when the fuse element 42 is in the cut-off condition, a small amount of current leaks between the node (H level) of the latch circuit 43 and the ground $V_{SS}$ and steadily flows in the fuse element 42 of the cut-off condition.

Due to such steady current leak, the glow-back phenomenon is caused in the material (for example, Al, Cu) of the fuse element 42. While the cycle of power supply between ON and OFF is repeated for many times, the fuse element 42 of the cut-off condition is connected again after the gradual change by the glow-back phenomenon and thereby the resistance value is reduced. As a result, a problem arises when even if the fuse is set in the cut-off condition, the address corresponding to the no cut-off condition of the fuse is generated due to erroneous data latch of the cut-off information of the fuse.

Furthermore, as the related art of the present invention, there may be a fuse ROM circuit disclosed in Japanese Patent Laid-open Publication No. 8-321197.

The fuse ROM circuit has a ROM cell where a fuse element, a first switch transistor and a second switch transistor are sequentially connected in series between the power supply source $V_{DD}$ and the ground $V_{SS}$ The connection node of the first switch transistor and the second switch transistor is connected to the node of a latch circuit. The fuse ROM circuit further has a gate control circuit which outputs a control signal for controlling the ON/OFF conditions of the first switch transistor and second switch transistor.

This gate control circuit controls the ON/OFF conditions of the first switch transistor and the second switch transistor after the power supply is turned ON and after the level of the power supply source $V_{DD}$ is stabilized at the predetermined voltage, for example, to 3.3V. Therefore, a longer period of time is required until the cut-off information of the fuse element is latched in the latch circuit after the power supply is turned ON.

BRIEF SUMMARY OF THE INVENTION

The present invention has been proposed considering the problems explained above, and therefore it is a general objective of the present invention to provide an address generating circuit which can accurately latch the cut-off information of the fuse and output the accurate address by preventing re-connection of the fuse element due to the glow-back phenomenon even if the cycle of the power supply between the state of ON and OFF is repeated.

Another and a more specific objective of the present invention is to provide an address generating circuit comprising: a first switch transistor of which one end is connected to a power supply source and the other end is connected to a first node; a second switch transistor of which one end is connected to said first node and the other end is connected to a second node; a fuse element of which one end is connected to said second node and the other end is connected to the ground; a power-ON reset circuit for outputting a first reset signal for controlling ON/OFF conditions of said first switch transistor and a second reset signal for controlling ON/OFF conditions of said second switch transistor, and a latch circuit of which the input terminal is connected to said first node, said latch circuit latching and outputting a predetermined potential corresponding to cut-off or no cut-off condition of said fuse element, wherein said first reset signal turns ON said first switch transistor during a first period immediately after the power supply is turned ON and always holds said first switch transistor in the OFF condition after said first period is completed, wherein said second reset signal turns ON said second switch transistor at least during a second period after said first period and always holds said second switch transistor in the OFF condition after said second period is completed.

Since the second switch transistor of the present invention can be turned OFF in accordance with the second reset signal, a current path which steadily forms between the ground and the input terminal of the latch circuit during the period from turning the power supply from ON to OFF can be prevented.

Therefore, a steady leak of current flowing through the fuse element in the cut-off condition can be prevented. Furthermore, the fuse element which is cut off is again connected due to the glow-back phenomenon can also be prevented. Moreover, the accurate address can be outputted by accurately latching the cut-off information of the fuse.

DETAILED DESCRIPTION OF THE INVENTION

Figure 1:
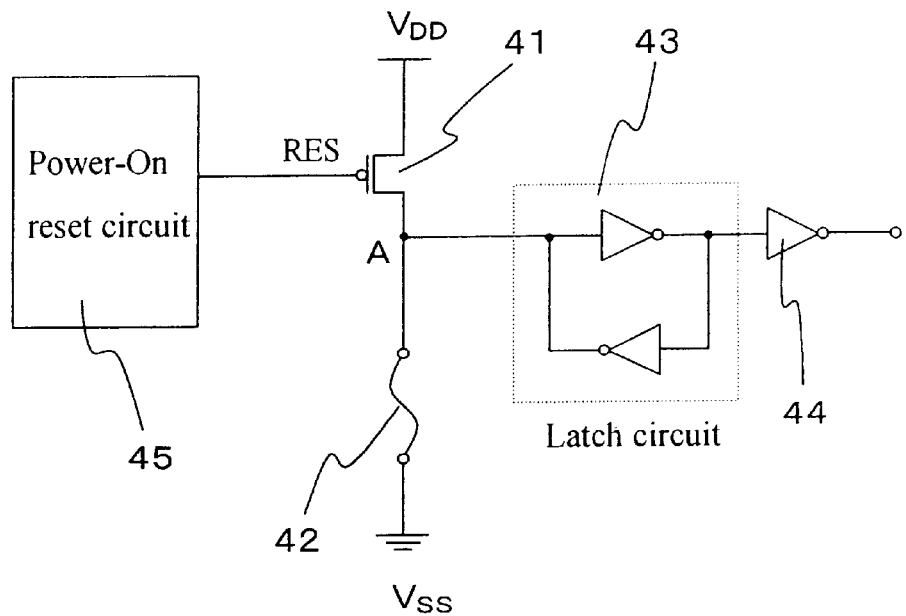
FIG. 1(a) is a schematic diagram of the address generating circuit of the conventional art.
FIG. 1(b) is a waveform diagram illustrating the waveform of the reset signal RES.
Figure 1:
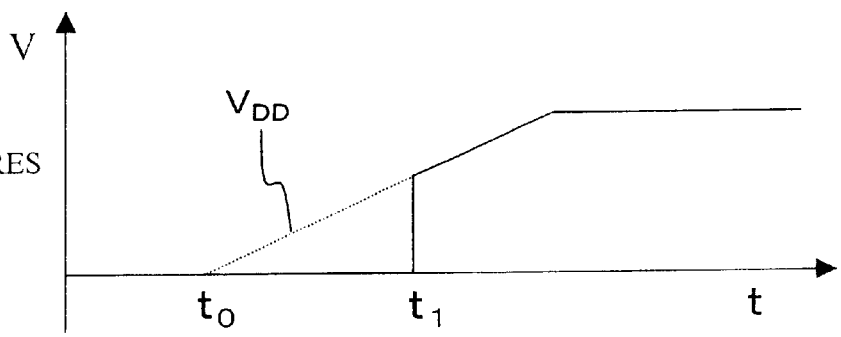
Figure 2:
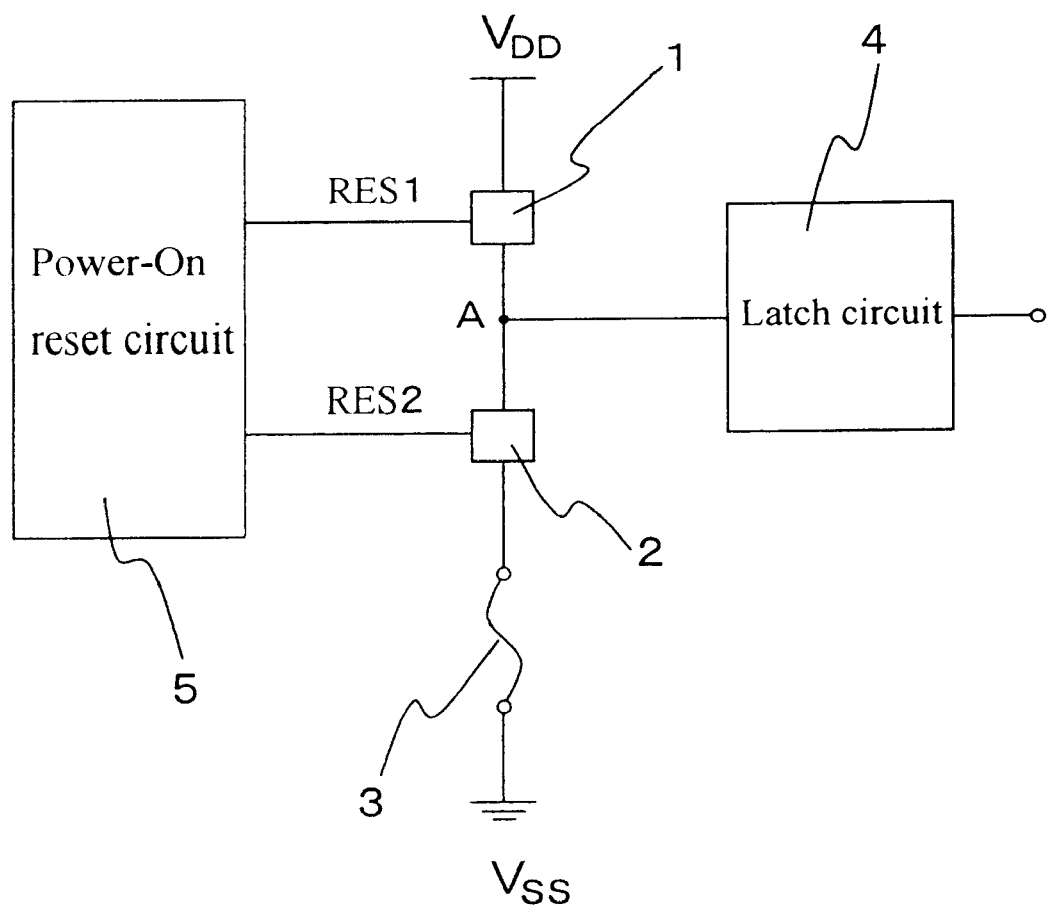
FIG. 2 is a schematic diagram of the address generating circuit of the present invention.

FIG. 2 is a schematic diagram of the address generating circuit of the present invention. In this figure, reference numeral 1 designates a first switch transistor; reference numeral 2 designates a second switch transistor; reference numeral 3 designates a fuse element; reference numeral 4 designates a latch circuit; and reference numeral 5 designates a power-ON reset circuit.

In the address generating circuit of the present invention, the power supply source $V_{DD}$, first switch transistor 1, second switch transistor 2, fuse element 3 and ground $V_{SS}$ are sequentially connected in series. The connection node of the first switch transistor 1 and second switch transistor 2 is connected to the input terminal of the latch circuit 4. Moreover, the power-ON reset circuit 5 outputs a first reset signal RES1 for controlling the ON/OFF conditions of the first switch transistor 1, and also outputs a second reset.signal RES2 for controlling the ON/OFF conditions of the second switch transistor 2.

The first reset signal RES1 is a control signal for turning on the first switch transistor 1 during the first period immediately after the power supply is turned ON, and for turning OFF the first switch transistor 1 steadily after the first period.

The second reset signal RES2 is a control signal for turning ON the second switch transistor 2 at least during the second period after the first period and for turning OFF the second switch transistor 2 steadily at least after the second period.

Operations of the address generating circuit of the present invention will be explained.

During the first period after the power supply is turned ON, the first switch transistor 1 is turned ON in accordance with the first reset signal RES1. Thereafter, charges are supplied from the power supply source to the connection node A of the first switch transistor 1 and the second switch transistor 2. Node A is then held in the certain positive potential.

In the second period, the first switch transistor 1 is turned OFF in accordance with the first reset signal RES1 and the second switch transistor 2 is turned ON in accordance with the second reset signal RES2.

Therefore, when the fuse element 3 is in the no cut-off condition, charges accumulated in node A are transferred to the ground $V_{SS}$ via the second switch transistor 2 and the fuse element 3. Accordingly, node A is set in the ground potential. However, when the fuse element 3 is in the cut-off condition, certain charges-are held in node A and node A is thereby maintained in the certain positive potential.

After the second period, the first switch transistor 1 is turned OFF and the second switch transistor 2 is also turned OFF in accordance with the second reset signal RES2. Therefore, the connection node A is isolated from the power supply source $V_{DD}$ and ground $V_{SS}$ by the first switch transistor 1 and second switch transistor 2.

Accordingly, when the fuse element 3 is in the no cut-off condition, the connection node A is in the ground potential, and therefore the input terminal of the latch circuit 4 is set in the ground potential. On the other hand, when the fuse element 3 is in the cut-off condition, the connection node A is maintained in the certain positive potential, and therefore the input terminal of the latch circuit 4 is set in the certain positive potential.

Accordingly, after the power supply is turned ON, the H level or L level is latched in the latch circuit 4 in accordance with the cut-off or no cut-off condition of the fuse element 3. When the fuse element 3 is in the cut-off condition, the H level signal is outputted from the latch circuit 4. However, when the fuse element 3 is in the no cut-off condition, the L level signal is outputted. Thereby, the address (binary information) stored in the address generating circuit is outputted.

Therefore, the address generating circuit of the present invention can prevent a current path from steadily forming between the input terminal of the latch circuit 4 and the ground $V_{SS}$ during the period from the turning ON to the turning OFF of the power supply because the second switch transistor 2 is always turned OFF in accordance with the second reset signal RES2 after the second period. Furthermore, the present invention can also prevent a steady leak of currents from flowing through the fuse element 3 even when it is in the cut-off condition.

Therefore, the address generating circuit of the present invention can prevent the fuse element of the cut-off condition from being connected again due to the glow-back phenomenon. As such, the cut-off information of the fuse can be accurately latched and the accurate address can be outputted.

First Embodiment

Figure 3:
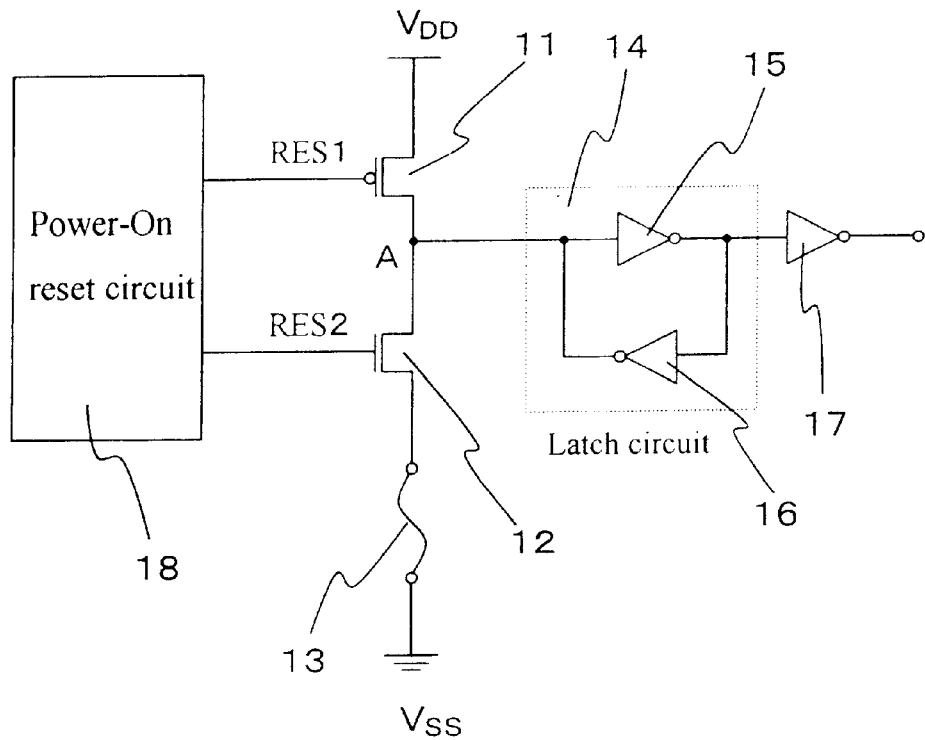
FIG. 3(a) is a schematic diagram of the address generating circuit of the first embodiment of the present invention.
FIG. 3(b) is a waveform diagram illustrating the waveforms of the first reset signal RES1.
Figure 3:
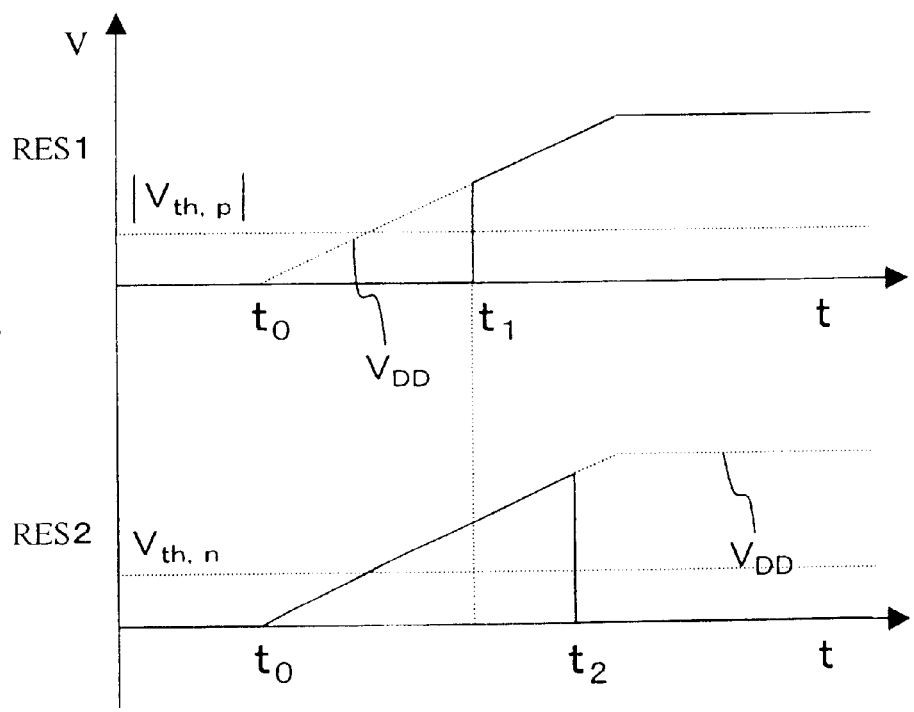

FIG. 3 illustrates a schematic diagram of the address generating circuit according to the first embodiment of the present invention.

FIG. 3(a) is a circuit diagram of the address generating circuit according to the first embodiment of the present invention. In this figure, reference numeral 11 is a PMOS transistor; reference number 12 is an NMOS transistor; reference numeral 13 is a fuse element; reference numeral 14 is a latch circuit; reference numeral 15 is a first inverter forming the latch circuit; reference numeral. 16 is a second inverter forming the latch circuit; reference numeral 17 is a third inverter; and reference numeral 18 is a power-ON reset circuit.

In FIG. 3(a), the PMOS transistor 11, NMOS transistor 12 and fuse element 13 are sequentially connected in series between the power supply source $V_{DD}$ and the ground $V_{SS}$. The latch circuit 14 is comprised of the first inverter 15 and second inverter 16, and the input terminal of one inverter and the output terminal of the other inverter are mutually connected. The connection node A of the PMOS transistor 11 and NMOS transistor 12 is connected to the input node of the latch circuit 14. The output node in the opposite side of the latch circuit 14 is connected to the third inverter 17.

It is required to determine the size of both PMOS transistor 11 and NMOS transistor 12 so that when both PMOS transistor 11 and NMOS transistor 12 are in the ON condition and the fuse element 13 is in the no cut-off condition, (namely a through current flows from the power supply source $V_{DD}$ to the ground $V_{SS}$), the potential of the connection node A becomes smaller than the input threshold value of the latch circuit 14.

In particular, when the threshold value of the latch circuit 14 is identical to $V_{DD}/2$, it is desirable that the size (for example, the width of gate electrode) of the PMOS transistor 11 and the size of the NMOS transistor 12 is designed so that the ON resistance of PMOS transistor 11 becomes larger than the sum of the ON resistance of the NMOS transistor 12 and the resistance of the fuse element 13 during the no cut-off condition.

Moreover, the fuse element 13 is formed, for example, of the material such as Al and Cu.

The power-ON reset circuit 18 outputs the first reset signal RES1 for the ON/OFF control to the gate of the PMOS transistor 11 and also outputs the second reset signal RES2 for the ON/OFF control to the gate of the NMOS transistor 12.

FIG. 3(b) is a waveform diagram illustrating the waveforms of the first reset signal RES1 and the second reset signal RES2 outputted from the power-ON reset signal 18. In this figure, the horizontal axis t indicates time and the vertical axis V indicates voltage and $t_0$ is the time when the power supply is turned ON.

Also illustrated in FIG. 3(b), when the power supply is turned ON at the time $t_0$, the potential of the power supply source $V_{DD}$ rises with passage of time and when it reaches the predetermined power supply voltage, for example, 3.3V, the potential is maintained at this power supply voltage.

Additionally, the power-ON reset circuit 18 operates in response to such rising of the level of this power supply source $V_{DD}$ and outputs the first reset signal RES1 The first reset signal RES1 holds the ground potential until time $t_1$ is delayed as much as the predetermined time from the time $t_0$ ($t_0$ is the time when the power supply is turned ON), and has the waveform following the rising of the level of the power supply source $V_{DD}$ after the time $t_1$. Namely, the first reset signal RES1 has the waveform in which the level rises like a step at time $t_1$ as illustrated in FIG. 3(b).

Time $t_1$ is determined to assure that the level of the power supply source $V_{DD}$ at this time becomes higher than the absolute value of the threshold value $V_{th,P}$ of the PMOS transistor 11.

In addition, the power-ON reset circuit 18 operates in response to the above rising of the level of the power supply source $V_{DD}$ and outputs the second reset signal RES2. The second reset signal RES2 follows the rising of the level of the power supply source $V_{DD}$ during the period from time $t_0$ until time $t_2$ and is delayed as much as the predetermined time from time ti and has the waveform holding the ground potential after time $t_2$. Namely, the second reset signal RES2 has the waveform of which the level drops like a step at the time $t_2$ as illustrated in FIG. 3(b).

Time $t_2$ is determined to provide the result that the level of power supply source $V_{DD}$ is higher than the threshold value $V_{th,n}$ of the NMOS transistor 12 and the time difference from the time $t_1$ become longer than the data determination time of the latch circuit 14. Since the data determination time of the latch circuit 14 is usually in the range from about several tens nsec to several tens psec, it is preferable that the time difference between the times $t_1$ and $t_2$ is reserved at least as about several tens nsec.

Operations of the address generating circuit of FIG. 3(a) will be explained with reference to the waveforms of the first and second reset signals RES1, RES2 as illustrated in FIG. 3(b).

After the power supply is turned ON, the first reset signal RES1 is maintained in the ground potential during the period from time $t_0$ to time $t_1$. Therefore, the PMOS transistor 11 is turned ON. Meanwhile, since the second reset signal RES2 has the level following the rising of the level of the power supply source $V_{DD}$ and outputs the positive potential higher than the threshold voltage of the NMOS transistor 12, the NMOS transistor 12 is turned ON.

Accordingly, charges are supplied from the power supply source $V_{DD}$ to the connection node A, and therefore the connection node A is maintained at the certain positive potential higher than the input threshold value of the latch circuit 14.

Next, during the period from time $t_1$ to time $t_2$, the first reset signal RES1 rises to the level like a step and outputs the level higher than the absolute value of the threshold voltage of the PMOS transistor 11. In this case, the potential difference $V_{GS}$ between the gate and source of the PMOS transistor 11 ($V_{GS}$=RES1−$V_{DD}$) becomes 0V and its absolute value becomes smaller than the absolute value of the threshold value $V_{th,P}$. Therefore, the PMOS transistor 11 is turned OFF.

The second reset signal RES2 has the level following the rising of the level of the power supply source $V_{DD}$ and outputs the positive potential larger than the threshold voltage of the NMOS transistor 12. Therefore, the NMOS transistor 12 is maintained at the ON condition.

Accordingly, when the fuse element 13 is in the no cut-off condition, charges accumulated in the connection node A are transferred to the ground $V_{SS}$ via the NMOS transistor 12 and fuse element 13. The input node of the latch circuit 14 is thereby maintained at the ground potential. On the other hand, when the fuse element 13 is in the cut-off condition, certain charges are held in the connection node A and the potential of the input node of the latch circuit is held at a certain positive potential.

In addition, after time $t_2$, the level of the first reset signal RES1 is maintained at the positive potential higher than the absolute value of the threshold voltage of PMOS transistor 11. The PMOS transistor 11 is thereby turned OFF. Since the level of the second reset signal RES2 drops like a step and is maintained at the ground potential, the NMOS transistor 12 is turned OFF. Therefore, the connection node A is isolated from the power supply source $V_{DD}$ and the ground $V_{SS}$ by the PMOS transistor 11 and NMOS transistor 12.

Therefore, when the fuse element 13 is in the no cut-off condition, the connection node A is in the ground potential and the input node of the latch circuit 14 is set to the ground potential. However, when the fuse element 13 is in the cut-off condition, the connection node A is kept at the certain positive potential higher than the input threshold value of the latch circuit 14. Therefore, the input node of the latch circuit 14 is set in this positive potential.

Accordingly, after the power supply is turned ON, the H level or L level is latched in the latch circuit 14 in accordance with the cut-off or no cut-off condition of the fuse element 13. When the fuse element 13 is in the cut-off condition, the L level signal is outputted from the latch circuit 14. When the fuse element 13 is in the no cut-off condition, the H level signal is outputted. The output signal of latch circuit 14 is inputted to the third inverter 17 and the signal is inverted by the third inverter 17 and is outputted as the address (binary information) stored in the address generating circuit.

According to the first embodiment of the present invention, the NMOS transistor 12 is always turned OFF in accordance with the second reset signal RES2 during the period after time $t_2$. A current path via the input node of the latch circuit 14, fuse element 13 and the ground $V_{SS}$ is cut off when the NMOS transistor 12 is turned OFF.

Therefore, a current path is prevented from forming steadily between the input node of latch circuit 14 and the ground $V_{SS}$ during the period from the turning ON to turning OFF of the power supply. Therefore, even when the fuse element 13 is in the cut-off condition, a leak current is prevented from flowing steadily through the fuse element 13.

Therefore, according to the address generating circuit of the first embodiment, the fuse element of the cut-off condition is prevented from being connected again due to the glow-back phenomenon, and therefore the accurate address can be outputted by accurately latching the cut-off information of fuse.

Second Embodiment

Figure 4:
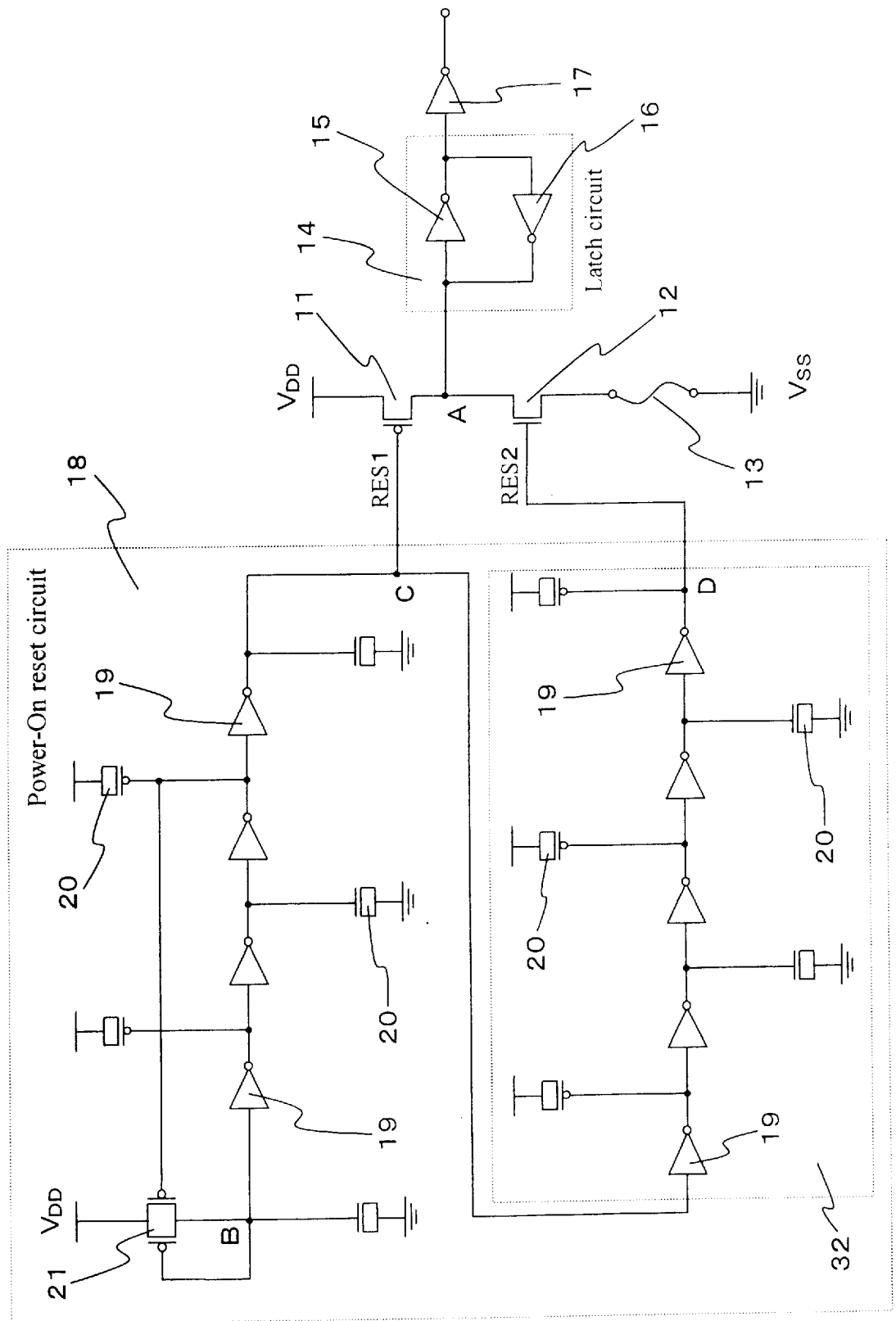
FIG. 4 is a schematic diagram of the address generating circuit of the second embodiment of the present invention.

FIG. 4 is a schematic diagram of the address generating circuit of the second embodiment of the present invention. The second embodiment of the present invention provides a circuit example of the power-ON reset circuit in the first embodiment.

In this figure, the elements disclosed in FIG. 3 are designated with the like reference numerals. Furthermore, reference numeral 19 is an inverter; reference number 20 is a transistor of which the source and drain are terminated; reference numeral 21 is a PMOS transistor; and reference numeral 32 is an inverter delay circuit.

As illustrated in FIG. 4, the power-ON reset circuit 18 in the second embodiment has a structure that contains two PMOS transistors 21, of which the source and drain are connected to each other, and are connected in parallel between the power supply source $V_{DD}$ and the ground $V_{SS}$. The gate of one PMOS transistor is connected to the drain to form a diode transistor.

Moreover, the power-ON reset circuit 18 has a structure containing a plurality of inverters 19 connected in series from the connection node B in the drain side of the two PMOS transistors 21. The gate of the transistor 20, of which the source and the drain are terminated, is connected to each connection node between the inverters. The terminated source and drain are connected to the power supply source $V_{DD}$ or the ground $V_{SS}$. With each transistor 20, capacitance coupling with the power supply source $V_{DD}$ or the ground $V_{SS}$ is formed for each connection node.

The output node C of the even number stage from the node B is connected to the gate of PMOS transistor 11. The first reset signal is outputted from the node C. The inverter column consisting of a plurality of inverters is connected in series in the subsequent stage of the node C and it forms an inverter delay circuit 32. The output node D of the odd number stage is connected to the gate of NMOS transistor 12. The second reset signal is outputted from the node D.

The waveforms of the first and second reset signals will be explained based on the structure of the power-ON reset circuit of FIG. 3.

During the certain period after time $t_0$ ($t_0$ is the time when the power supply is turned ON), node C is coupled with the ground $V_{SS}$ through the capacitance and thereby the potential of node C is fixed at the ground potential.

Since the node B is connected to the power supply source $V_{DD}$ via the PMOS transistor 21, after time $t_0$, the potential of node B rises with the passage of time in accordance with the rising level of the power supply source $V_{DD}$. In this case, the potential of node B is lower than the level of the power supply source $V_{DD}$ by the absolute value of the threshold value of the PMOS transistor 21 forming the diode transistor.

When the potential of node B becomes higher than the threshold value of the NMOS transistor forming the first stage inverter, the first stage inverter is activated to output the L level signal. Namely, the first stage inverter is activated when the level of the power supply source $V_{DD}$ is matched with a sum of the absolute value of the threshold value of the PMOS transistor forming the diode transistor and the threshold value of the NMOS transistor forming the first stage inverter.

This L level signal is inputted to the inverter of the next stage. Thereafter, a plurality of inverters connected in series is sequentially activated. These inverters form the inverter column.

In response to the activation of the inverters, the level of node C (which is the output node of the inverter of the even number stage), rises at time $t_1$ like a step and becomes the H level. The time delay from time $t_0$ to time $t_1$ is as much as the time corresponding to the number of stages of the inverters from the node B to the node C. Accordingly, the waveform of the first reset signal RES1 as illustrated in FIG. 3(b) is outputted.

Therefore, time $t_1$ in the first reset signal of FIG. 3(b) is determined depending on the threshold value of the PMOS transistor 21 forming the diode transistor of FIG. 4, the threshold value of the NMOS transistor forming the first stage inverter of the power-ON reset circuit of FIG. 4, and the number of stages of the inverters from node B to node C.

On the other hand, since node D has the capacitance coupling with the power supply source $V_{DD}$, after time $t_0$, the potential of node D rises with the passage of time in accordance with the rising level of the power supply source $V_{DD}$.

When the level of node C becomes the H level at time $t_1$ as explained above, this H level signal is inputted to the inverter of the next stage connected to node C. Thereafter a plurality of inverters connected in series are sequentially activated. Those inverters form the inverter column.

In response to the activation of the inverter, the level of node D (which is the output node of the inverter of the odd number stage), drops at time $t_2$ and becomes the L level. The time delay from time $t_1$ to time $t_2$ is as much as the time corresponding to the number of stages of the inverters from node C to node D. Accordingly, the waveform of the second reset signal RES2 as illustrated in FIG. 3(b) is outputted.

Therefore, the time $t_2$ of the second reset signal of FIG. 3(b) is determined depending on the number of stages of inverters up to node D from node C of the power ON reset circuit of FIG. 4.

The capacitance coupling by each transistor 20 in FIG. 4 also has a function to stabilize the potential of the connection node between the inverters during the period from being turned ON to OFF of the power supply.

Third Embodiment

Figure 5:
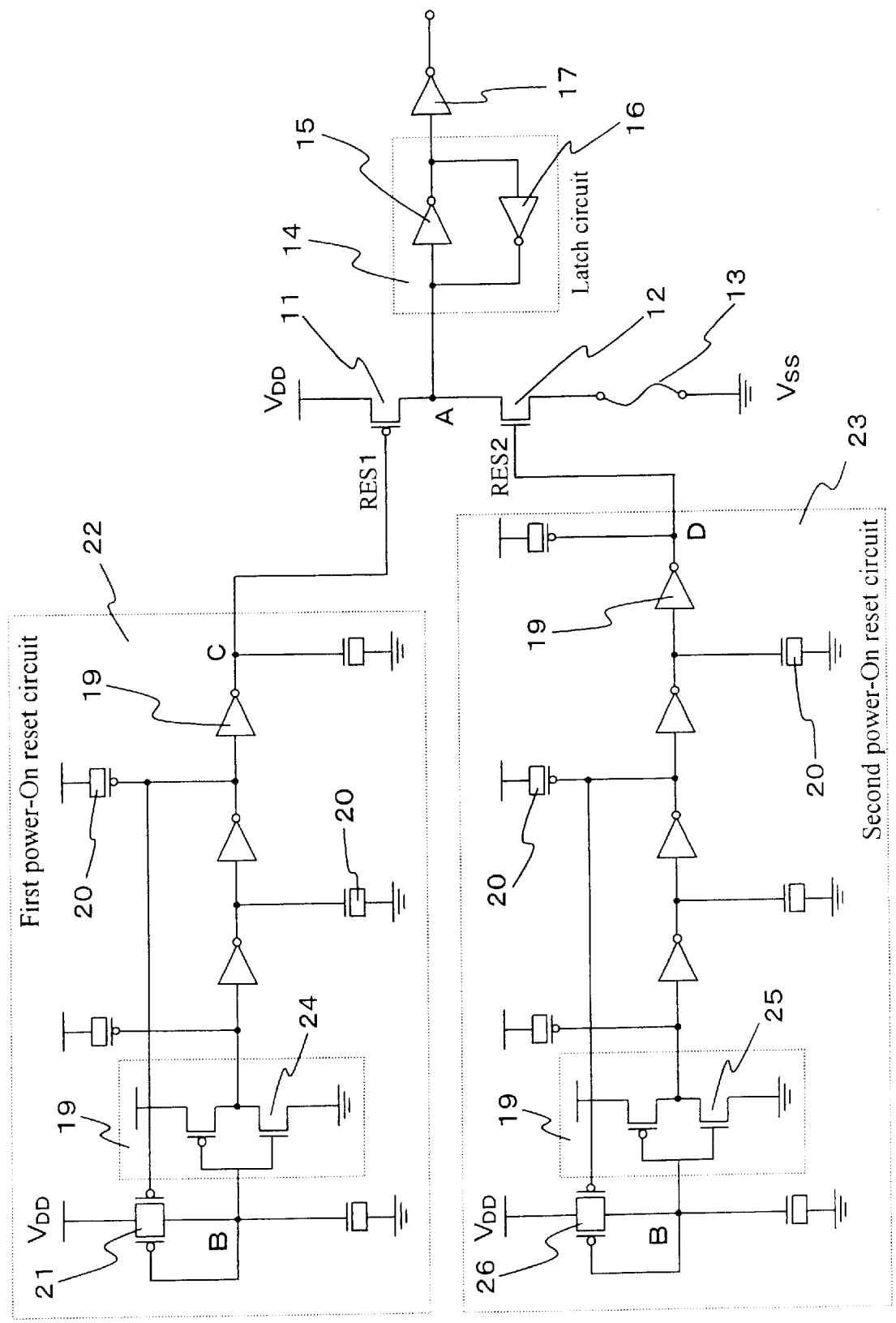
FIG. 5 is a schematic diagram of the address generating circuit of the third embodiment of the present invention.

FIG. 5 is a schematic diagram of the address generating circuit of the third embodiment of the present invention. In this figure, the elements similar to those disclosed in FIG. 2 are designated with the like reference numerals. In addition, reference numeral 22 is a first power-ON reset circuit; reference numeral 23 is a second power-ON reset circuit; reference numeral 24 is an NMOS transistor having a low threshold value; reference numeral 25 is an NMOS transistor having a high threshold value; and reference numeral 26 is a PMOS transistor.

The address generating circuit of the third embodiment of the present invention has a structure which is substantially similar to that of the first and second embodiments. However, the address generating circuit of the third embodiment is different in the structure of the power-ON reset circuit.

As illustrated in FIG. 5, the power-ON reset circuit of the third embodiment is comprised of a first power-ON reset circuit 22 for outputting the first reset signal RES1 to control the ON/OFF conditions to the gate of the PMOS transistor 11, and a second power-ON reset circuit 23 for outputting the second reset signal RES2 to control the ON/OFF conditions to the gate of the NMOS transistor 12.

The circuit structure of the power-ON reset circuits 22, 23 is almost similar to that of the second embodiment. However, the power-ON reset circuits 22, 23 of the third embodiment is designed so that at least a sum of the absolute value of the threshold value of the PMOS transistor 26 forming the diode transistor, and the threshold value of the NMOS transistor 25 forming the first stage inverter in the second power-ON reset circuit 23, becomes larger than a sum of the absolute value of the threshold value of the PMOS transistor 21 and the threshold value of the NMOS transistor 24 forming the first stage inverter in the first power ON reset circuit 22.

Moreover, the first power-ON reset circuit 22 is comprised of an inverter column including inverters of even number stages connected in series, and the second power-ON reset circuit 23 is comprised of an inverter column including inverters of odd number stages connected in series.

As explained above, the time required for the first stage inverter of the power-ON reset circuit to be activated after the power supply is turned ON, depends on the threshold value of the PMOS transistor forming the diode transistor and the threshold value of the NMOS transistor forming the first stage inverter.

Therefore, the time differences from time $t_0$ ($t_0$ is the time when the power supply is turned ON) to time $t_1$, and from time $t_0$ to time $t_2$, are respectively set to the predetermined values by adequately adjusting the threshold values of the PMOS transistors 21, 26 (forming the diode transistor), and the NMOS transistors 24, 25 (forming the first stage inverter) in the first and second power-ON reset circuits 22, 23.

For example, when the threshold values of the PMOS transistors 21, 26 forming the diode transistor are identical to each other in the first and second power-ON reset circuits 22, 23, the threshold value of the NMOS transistor 24 forming the first stage inverter is set to become lower than that of the NMOS transistor 25.

When the threshold values of the NMOS transistors 24, 25 are identical to each other in the first and second power ON reset circuits 22, 23, the absolute value of the threshold value of the PMOS transistor 21 is set to become smaller than that of the PMOS transistor 26.

Therefore, the first and second power-ON reset circuits 22, 23 can output the waveforms of the first reset signal RES1 and second reset signal RES2 as illustrated in FIG. 3(b).

A means for adjusting the threshold value of the transistor can be achieved by adjusting the film thickness of the gate insulated film and the injection amount of ion in the channel doping process and so on, during the manufacturing process of the corresponding transistors.

As for the NMOS transistor 24 forming the first stage inverter in the first power-ON reset circuit 22 of the third embodiment, it is sufficient to have a transistor having a threshold value identical to that of NMOS transistor forming the first stage inverter in the power-ON reset circuit of the second embodiment, and essentially having an identical structure to that of NMOS transistor.

Moreover, as for the PMOS transistor 21 forming the diode transistor in the first power-ON reset circuit 22 of the third embodiment, it is also sufficient to have a transistor having a threshold value identical to that of the PMOS transistor forming the diode transistor in the power ON reset circuit of the second embodiment, and essentially having an identical structure to that of the PMOS transistor.

The threshold values of the other transistors can be designed appropriately in the first and second power-ON reset circuits 22, 23. In each power-ON reset circuit 22, 23, the threshold values of all PMOS and NMOS transistors may be changed similarly to the PMOS transistors 21, 26 forming the diode transistors and the NMOS transistors 23, 25 of the first stage inverter. Moreover, only the PMOS transistors 21, 26 and NMOS transistors 24, 25 may have the threshold values different from that of the other transistors.

Fourth Embodiment

Figure 6:
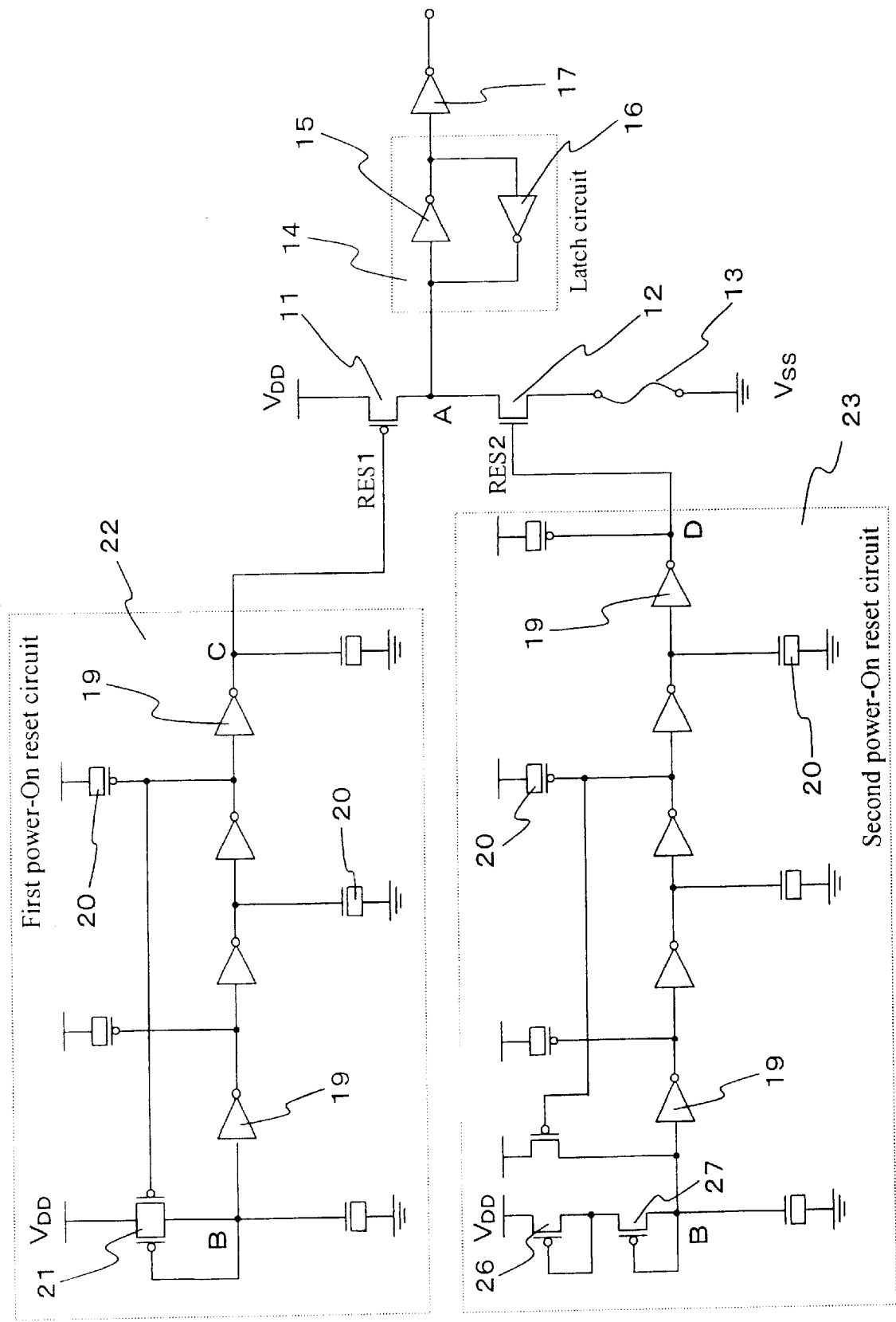
FIG. 6 is a schematic diagram of the address generating circuit of the fourth embodiment of the present invention.

FIG. 6 is a schematic diagram illustrating the address generating circuit of the fourth embodiment of the present invention. In this figure, the elements similar to those disclosed in FIG. 5 are designated with the like reference numerals. Additionally, reference numeral 27 designates a PMOS transistor of diode connection.

The address generating circuit of the fourth embodiment of the present invention has a similar structure to that of the first and third embodiments. However, the power-ON reset circuit has a different structure.

As illustrated in FIG. 6, each circuit structure of the first and second power-ON reset circuits 22, 23 is substantially similar to that which is disclosed in the third embodiment. However, in the second power-ON reset circuit 23, at least a PMOS transistor 27 of which the gate and drain are connected to each other is further connected between the drain of the PMOS transistor 26 forming the diode transistor and the node B. In addition, a diode transistor is added.

Accordingly, the absolute value of the threshold value of the PMOS transistor forming the diode transistor in the second power-ON reset circuit 23 can thereby be substantially increased. Therefore, the absolute value of the threshold value of the PMOS transistor forming the diode transistor in the second power-ON reset circuit 23 can be set larger than the absolute value of the threshold value of the PMOS transistor 21 in the first-power ON reset circuit 22.

Therefore, the time differences from time $t_0$ to time $t_1$ and from time $t_0$ to time $t_2$ in FIG. 3(*b*) can be set respectively to the predetermined values.

In addition, the first and second power-ON reset circuits 22, 23 can output the waveforms of the first reset signal RES1 and the second reset signal RES2 illustrated in FIG. 3(*b*).

Here, the threshold values of the PMOS transistors 21, 26 and 27 can be designed appropriately, but the transistors having the identical threshold value, particularly the transistors having the identical structure may be used as the PMOS transistors 21, 26 and 27. In this case, the absolute value of the threshold value of PMOS transistor forming the diode transistor in the second power-ON reset circuit 23 can be substantially twice increased in comparison with that of the first power-ON reset circuit 22.

Fifth Embodiment

Figure 7:
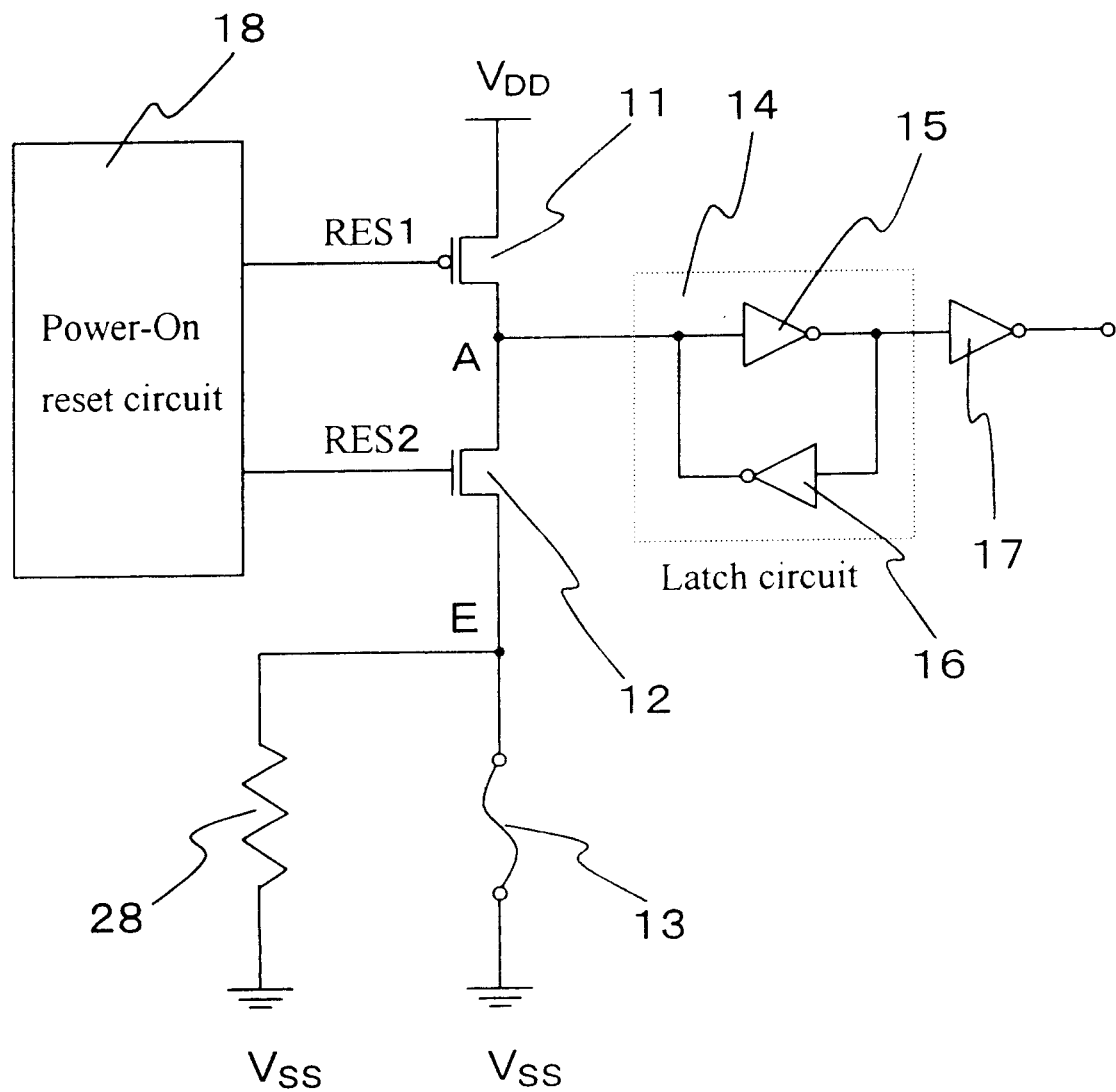
FIG. 7 is a schematic diagram of the address generating circuit of the fifth embodiment of the present invention.

FIG. 7 is a schematic diagram of the address generating circuit of the fifth embodiment of the present invention. In this figure, the elements similar to those disclosed in FIG. 3 are designated with the like reference numerals. In addition, reference numeral 28 is a resistance element.

The address generating circuit of the fifth embodiment of the present invention has a structure substantially similar to that of the first embodiment. However, the resistance element 28 is formed in parallel with the fuse element 13 between the ground $V_{SS}$ and the connection node E of the NMOS transistor 12 and fuse element 13.

As explained above, during the period after time $t_2$, a current path via the input node of latch circuit 14, fuse element 13 and the ground $V_{SS}$ is steadily cut off because the level of the second reset signal RES2 is maintained at the ground potential and the NMOS transistor 12 is turned OFF.

However, when the fuse element 13 is in the cut-off condition, a certain amount of charges are accumulated at the connection node E of the NMOS transistor 12 and fuse element 13 immediately after the NMOS transistor 12 is turned OFF. The accumulated charges are released to the ground $V_{SS}$ through the fuse element 13 of the cut-off condition. Therefore, even when the NMOS transistor 12 is turned OFF, a minute leak current between the connection node E and the ground $V_{SS}$ flows through the fuse element 13 during a very short period after time $t_2$.

This minute leak current generates the glow-back phenomenon of the material (for example, Al, Cu) of the fuse element 13. The period when this leak current flows through the fuse element 13 is very short. However, while the cycle of the power supply between the ON and OFF state is repeated a plurality of times, it is probable that the fuse element 13 (which is cut off) is connected again after a certain gradual change due to the glow-back phenomenon.

Therefore, in the address generating circuit of the fifth embodiment, a resistance element 28 is formed in parallel with the fuse element 13 between the ground $V_{SS}$ and the connection node E in order to prevent a minute leak current flowing through the fuse element 13 within such short period. The resistance element 28 needs a resistance value which is at least larger than that of said fuse element of no cut-off condition.

Accordingly, a certain amount of charges accumulated in the connection node E, immediately after the NMOS transistor 12 is turned OFF, is quickly released to the ground $V_{SS}$ through the resistance element 28. Therefore, the address generating circuit of the fifth embodiment can effectively prevent the fuse element from being connected again due to the glow-back phenomenon. Furthermore, the accuracy of latching the cut-off information of the fuse can be improved.

The resistance element 28 of the fifth embodiment, for example, may be a poly-silicon formed on a silicon substrate. Moreover, a diffusion layer formed on the silicon substrate and a transistor which is always set in the ON condition may be used.

Additionally, a resistance value of the resistance element 28 is set sufficiently larger than that of the NMOS transistor 12 during the ON condition and is set sufficiently smaller than that of the fuse element 13 at the cut-off condition. In general, the resistance value of the NMOS transistor during the ON condition is about several hundreds $\Omega$(ohm) and the resistance value of the fuse element at the cut-off condition is about 1 M $\Omega$ or higher. Therefore, it is enough when the resistance value of the resistance element 28 is set, for example, around several tens of k $\Omega$. The reason is explained below.

It is more desirable for the resistance value of the resistance element 28 to be set smaller so that the charges accumulated in the connection node E can be quickly released to the ground $V_{SS}$. However, if the resistance value of the resistance element 28 is too small, the resistance value between the connection node E and the ground $V_{SS}$ becomes remarkably smaller than that (about several M Ω) of the fuse element 13 of the cut-off condition. This is because the resistance element 28 is provided in parallel with the fuse element 13.

In this case, even if the fuse element 13 is in the cut-off condition, charges accumulated in the connection node A of the PMOS transistor 11 and NMOS transistor 12 transfer to the ground $V_{SS}$ via the resistance element during the period from time $t_1$ to time $t_2$ Therefore, the latch circuit 14 can no longer latch the H level corresponding to the cut-off condition of the fuse element 13.

As the power-ON reset circuit 18, all the power-ON reset circuits illustrated in FIG. 2 to FIG. 4 may be used.

Sixth Embodiment

FIGS. 8(a) and 8(b) are a schematic diagram of the address generating circuit of the six embodiment of the present invention.

FIG. 8(a) is a circuit diagram of the address generating circuit of the sixth embodiment of the present invention. The elements similar to those disclosed in FIG. 2 are designated with the like reference numerals. In addition, reference numeral 29 designates an NMOS transistor, and reference numeral 30 designates a third power-ON reset circuit. Moreover, FIG. 8(b) is the waveform diagram illustrating the waveforms of the first, second and third reset signals RES1, RES2 and RES3.

The address generating circuit of the sixth embodiment of the present invention has a structure similar to that of the fifth embodiment. However, the address generating circuit of the sixth embodiment is different in that an NMOS transistor 29 is formed in parallel with the fuse element 13 between the ground $V_{SS}$ and the connection node E of the NMOS transistor 12 and fuse element 13 rather than the resistance element 28.

Moreover, the third reset signal RES3 is inputted to the gate of the NMOS transistor 29 from the third power-ON reset circuit 30. The third reset signal RES3 is a control signal for controlling the ON/OFF conditions of the NMOS transistor 29.

The third reset signal RES3 holds the ground potential until time $t_3$ after the delay from time $t_2$ ($t_2$ is the time when the level of the second reset signal drops like a step) and from time $t_0$ ($t_0$ is the time when the power supply is turned ON). The third reset signal RES3 has the waveform following the rising of the level of the power supply source $V_{DD}$ after time $t_3$. Namely, the third reset signal RES3 has the waveform of which the level rises like a step at time $t_3$ as illustrated in FIG. 8(b).

In the address generating circuit of the sixth embodiment, the NMOS transistor 29 turns ON after the time $t_3$ and charges accumulated in the node E immediately after the NMOS transistor 12 is turned OFF, are quickly released to the ground $V_{SS}$ via the NMOS transistor 29. Therefore, a minute leak current between node E and the ground $V_{SS}$ can be prevented from flowing through the fuse element 13 within the short period after the time $t_2$.

In addition, the NMOS transistor 29 is turned OFF during the period before time $t_3$ as illustrated in FIG. 8(b) in the sixth embodiment. Therefore, when the fuse element 13 is in the cut-off condition, charges accumulated in the connection node A of the PMOS transistor 11 and NMOS transistor 12 do not transfer to the ground $V_{SS}$ during the period from time $t_1$ to time $t_2$ This is unlike the case of the fifth embodiment. Therefore, the NMOS transistor 29 does not prevent the latch circuit 14 from latching the H level corresponding to the cut-off condition of the fuse element 13.

Therefore, the address generating circuit of the sixth embodiment can effectively prevent the fuse element (which is cut off) from being reconnected due to the glow-back phenomenon. Moreover, the latch circuit can surely latch the H level corresponding to the cut-off condition of the fuse element during the period time $t_2$ from time $t_1$ to time $t_2$ when the fuse element is in the cut-off condition. Therefore, the latching accuracy of the cut-off information of fuse can be further improved.

In addition, all the power-ON reset circuits indicated in the second to the fourth embodiments may be used as the power-ON reset circuit 18.

Moreover, the circuit similar to the first power-ON reset circuit indicated in the third and fourth embodiments may be used as the third power-ON reset circuit 30.

Accordingly, the time difference from time $t_0$ to time $t_3$ in the third reset signal RES3 can be set longer than the time difference from time $t_0$ to time $t_2$ by adequately adjusting the absolute value of the threshold value of the PMOS transistor forming the diode transistor and the threshold value of the NMOS transistor forming the first stage inverter.

Modification Example

Figure 8:
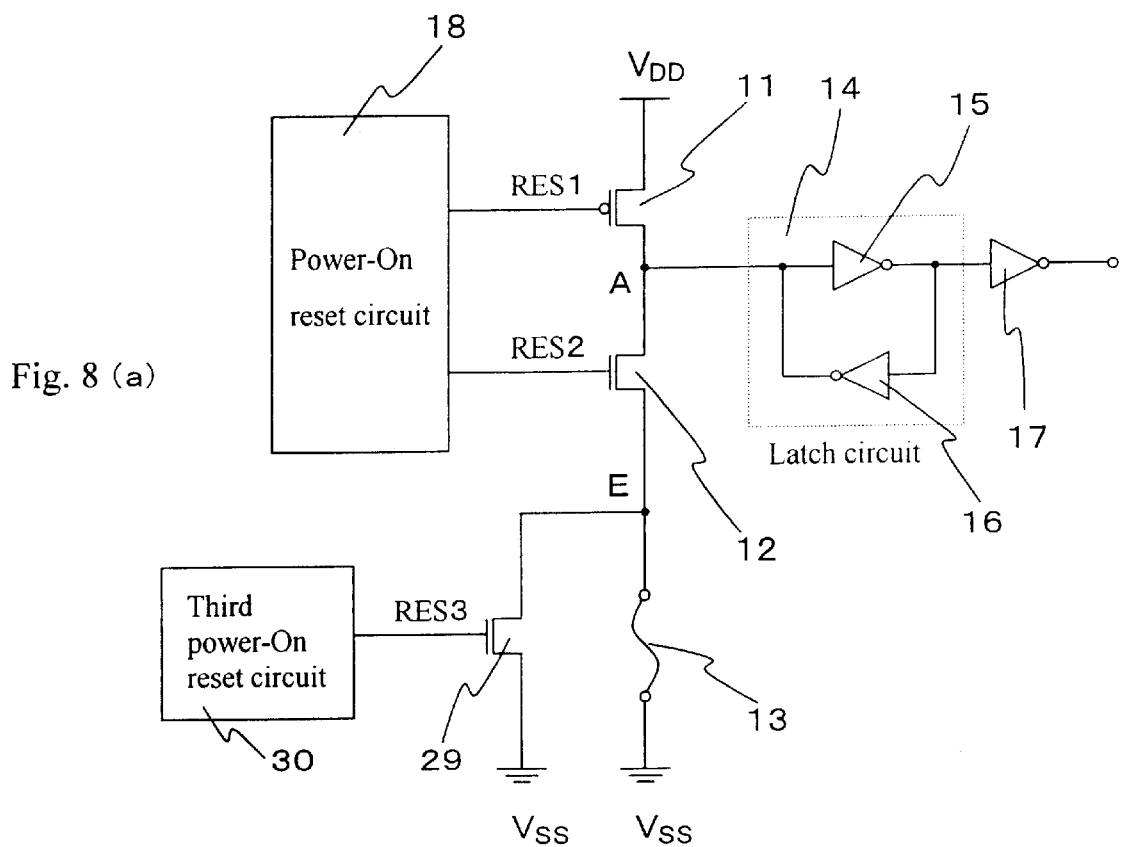
FIG. 8(a) is a schematic diagram of the address generating circuit of the sixth embodiment of the present invention.
FIG. 8(b) is a waveform diagram illustrating the waveforms of the first, second and third reset signals RES1, RES2 and RES3.
Figure 8:
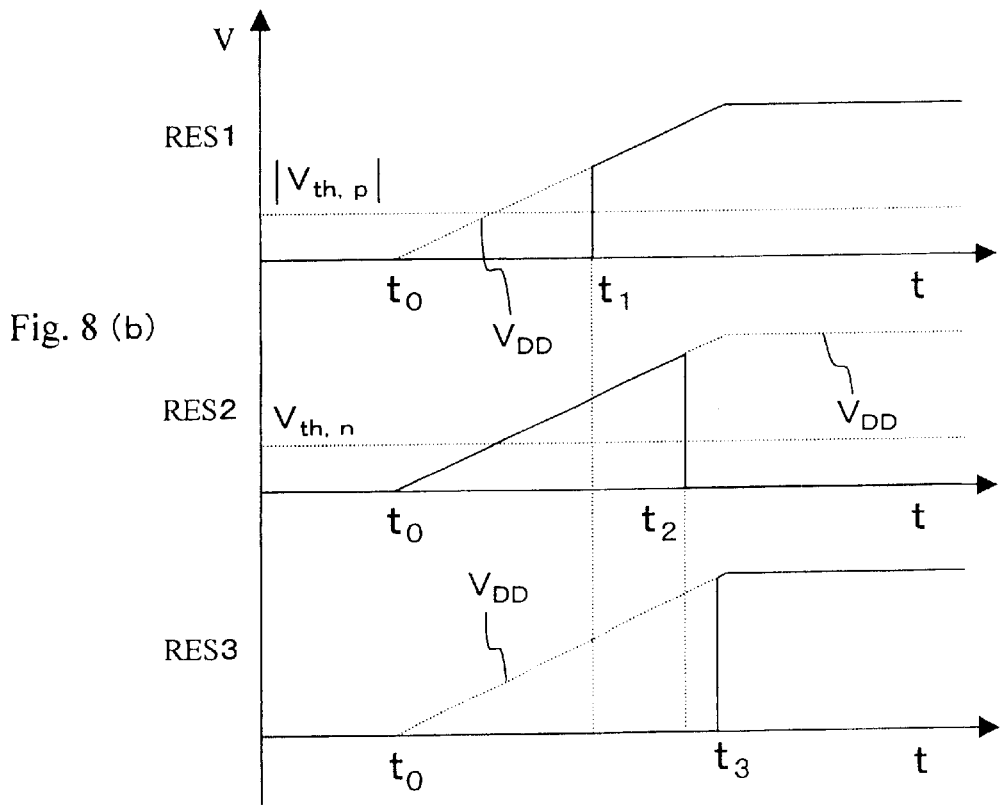
Figure 9:
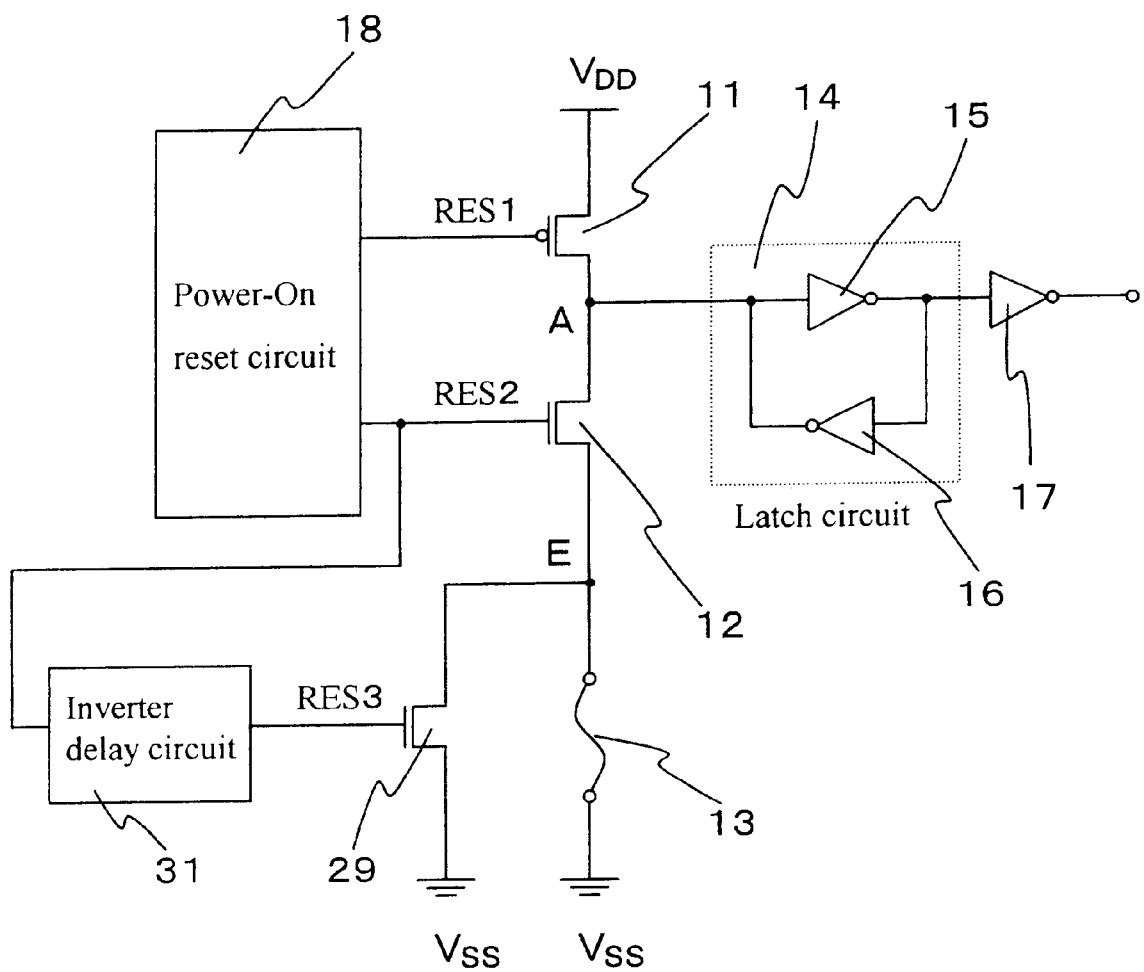
FIG. 9 is a diagram illustrating a modification example of the address generating circuit of the sixth embodiment of the present invention.

FIG. 9 is a modification example of the address generating circuit of the sixth embodiment. In this figure, the elements similar to those disclosed FIG. 8 are designated with the like reference numerals. In addition, reference numeral 31 is an inverter delay circuit.

As illustrated in FIG. 9, it is also possible to form an inverter delay circuit 31 as the output node of the second reset signal RES2 in the power-ON reset circuit 18. The inverter delay circuit 31 outputs the third reset signal RES3 to the gate of the NMOS transistor 29. Accordingly, the control signals having the waveforms of the first to third reset signals RES1, RES2, RES3 can also be outputted as illustrated in FIG. 8(b).

In FIG. 9, all the power-ON reset circuit indicated in the second to fourth embodiments may be also used as the power ON-reset circuit 18.

As the inverter delay circuit 31, the circuit substantially similar to the inverter delay circuit 32 in the third embodiment may be used. It can be formed by connecting in series a plurality of inverters. Additionally, the present invention may incorporate a fuse ROM circuit.

The present invention provides that the cut-off information of the fuse element is latched in the latch circuit by controlling the ON/OFF conditions of the transistors connected in series to the fuse element in combination with the rising of the level of the power supply source $V_{DD}$ immediately after the power supply is turned ON.

In the address generating circuit of the present invention, the power supply source $V_{DD}$, the first switch transistor, the second switch transistor, the fuse element and the ground $V_{SS}$ are sequentially connected in series. Moreover, the power-ON reset circuit outputs the first reset signal for controlling the ON/OFF conditions of the first switch transistor and the second reset signal for controlling the ON/OFF conditions of the second switch transistor.

Since the second switch transistor can be turned OFF in accordance with the second reset signal, the current path that is steadily formed between the ground $V_{SS}$ and the input terminal of the latch circuit during the period from turning ON to OFF of the power supply may be prevented. Therefore, a steady leak current may be prevented from flowing through the fuse element in the cut-off condition.

Additionally, the fuse element (which is cut off) can be prevented from being connected again due to the glow-back phenomenon. Moreover, the accurate address can be outputted by accurately latching the cut-off information of the fuse.

Accordingly, the present invention can provide much contribution to improvement of performance of the address generating circuit.

While the present invention has been described in reference to a specific embodiment, the scope of the invention is not limited to that embodiment and is deemed to include the scope as set out in the appended claimed and their equivalents.

What is claimed is:

1. An address generating circuit, comprising:
   a first switch transistor having one end connected to a power supply source and the other end connected to a first node;
   a second switch transistor having one end connected to said first node and the other end connected to a second node;
   a fuse element having one end connected to said second node and the other end connected to a ground;
   a power-ON reset circuit for outputting a first reset signal for controlling ON/OFF conditions of said first switch transistor, and a second reset signal for controlling ON/OFF conditions of said second switch transistor, and;
   a latch circuit having an input terminal connected to said first node, wherein said latch circuit latches and outputs a predetermined potential corresponding to a cut-off or a no cut-off condition of said fuse element,
   wherein said first reset signal turns ON said first switch transistor during a first period immediately after the power supply is turned ON, and holds said first switch transistor in the OFF condition after said first period is completed, and
   wherein said second reset signal turns ON said second switch transistor at least during a second period after said first period, and holds said second switch transistor in the OFF condition after said second period is completed.

2. The address generating circuit as claimed in claim 1, wherein said power-ON reset circuit comprises:
   a level generating unit for outputting a level which rises in accordance with a rising level of the power supply source;
   a first inverter delay circuit including a first inverter column comprised of a plurality of inverters connected in series from output terminal of said level generating unit, and;
   a second inverter delay circuit including a second inverter column comprised of a plurality of inverters connected in series from said first inverter column,
   wherein said first inverter delay circuit outputs said first reset signal and said second inverter delay circuit outputs said second reset signal.

3. The address generating circuit as claimed in claim 1, wherein said power-ON reset circuit comprises:
   a first power-ON reset circuit having a first level generating unit for outputting a level which rises in accordance with a rising level of the power supply source, and a first inverter delay circuit including a first inverter column comprised of a plurality of inverters connected in series from an output terminal of said first level generating unit, wherein said first power-ON reset circuit outputs said first reset signal, and;
   a second power-ON reset circuit having a second level generating unit for outputting a level which rises in accordance with a rising level of the power supply source, and a second inverter delay circuit including a second inverter column comprised of a plurality of inverters connected in series from output terminal of said second level generating unit, wherein said second power-ON reset circuit outputs said second reset signal,
   wherein a threshold value of a first stage inverter of said first inverter delay circuit is lower than that of a first stage inverter of said second inverter delay circuit.

4. The address generating circuit as claimed in claim 1, wherein said power ON reset circuit comprises:
   a first power-ON reset circuit having a first level generating unit for outputting a level which rises in accordance with a rising level of the power supply source, and a first inverter delay circuit including a first inverter column comprised of a plurality of inverters connected in series from output terminal of said first level generating unit, wherein said first power-ON reset circuit outputs said first reset signal, and;
   a second power-ON reset circuit having a second level generating unit for outputting a level which rises in accordance with a rising level of the power supply source, and a second inverter delay circuit including a second inverter column comprised of a plurality of inverters connected in series from output terminal of said second level generating unit, wherein said second power-ON reset circuit outputs said second reset signal,
   wherein the level outputted from said first-level generating unit is higher than the level outputted from said second level generating unit.

5. The address generating circuit as claimed in claim 1, wherein the address generating circuit further comprises:
   a resistance element connected in parallel with said fuse element, and connected between said second node and the ground and having a resistance value which is at least larger than that of said fuse element of a no cut-off condition.

6. The address generating circuit as claimed in claim 1, wherein the address generating circuit further comprises:
   a third switch transistor of which ON/OFF conditions are controlled in accordance with a third reset signal,
   wherein said third switch transistor is connected in parallel with said fuse element, and is connected between said second node and the ground, and
   wherein said third reset signal turns ON said third switch transistor at least after said second period is completed.

7. The address generating circuit as claimed in claim 6, wherein the address generating circuit further comprises:
   a third power-ON reset circuit having a third level generating unit for outputting a level which rises in accordance with a rising level of the power supply source, and a third inverter delay circuit including a third inverter column comprised of a plurality of inverters connected in series from an output terminal of said third level generating unit, wherein said third power-ON reset circuit outputs said third reset signal.

8. The address generating circuit as claimed in claim 6, wherein the address generating circuit further comprises:
a third inverter delay circuit including a third inverter column comprised of a plurality of inverters connected in series from an output terminal of said second reset signal in said power-ON reset circuit,
wherein said third inverter delay circuit outputs said third reset signal.

9. The address generating circuit as claimed in claim 1, wherein said fuse element comprises one of Al and Cu.

10. The address generating circuit as claimed in claim 1, wherein said first switch transistor is a PMOS transistor and said second switch transistor comprises an NMOS transistor.

11. The address generating circuit as claimed in claim 10, wherein said first reset signal holds the ground potential during said first period and has a waveform of which level rises like a step after said first period is completed.

12. The address generating circuit as claimed in claim 10, wherein said second reset signal follows rising of a level of the power supply source during said second, period and has a waveform of which level drops like a step after said second period is completed.

13. The address generating circuit as claimed in claim 6, wherein said third switch transistor comprises an NMOS transistor.

14. The address generating circuit as claimed in claim 13, wherein said third reset signal holds the ground potential during said first and second period and has a waveform of which level rises like a step after said second period is completed.

15. The address generating circuit as claimed in claim 2, 3, or 4, wherein said first inverter column is comprised of an even number of inverters and said second inverter column is comprised of an odd number of inverters.

16. The address generating circuit as claimed in claim 3, wherein each inverter in said first and second inverter column includes a PMOS transistor and an NMOS transistor connected in series between the power supply source and the ground,
wherein a threshold value of an NMOS transistor forming said first stage inverter of said first inverter delay circuit is lower than that of an NMOS transistor forming said first stage inerter of said second inverter delay circuit.

17. The address generating circuit as claimed in claim 4, wherein said first level generating unit includes a first diode transistor of which gate is connected to a drain thereof between the power supply source and the ground, and the drain of said first diode transistor is connected to said first inverter column,
wherein said second level generating unit includes a second diode transistor of which gate is connected to a drain thereof between the power supply source and the ground, and the drain of said second diode transistor is connected to said second inverter column,
wherein an absolute value of a threshold value of said second diode transistor is larger than that of said first diode transistor.

18. The address generating circuit as claimed in claim 5, wherein said resistance value is larger than that of said second switch transistor of ON condition and smaller than that of the fuse element of cut-off condition.

19. The address generating circuit as claimed in claim 2, 3, or 4, wherein capacitance coupling with the power supply source or the ground is formed for each connection node between a plurality of inverters forming said first and second inverter column.

20. The address generating circuit as claimed in claim 1, wherein the address generating circuit is a redundant address generating circuit for storing a redundant address in a memory cell array in a semiconductor memory and generating said redundant address when the power supply is turned ON,
wherein said fuse element is set in the cut-off condition or no cut-off condition corresponding to said redundant address.

* * * * *